United States Patent
Wan et al.

(10) Patent No.: US 10,264,706 B2
(45) Date of Patent: Apr. 16, 2019

(54) PHASE CHANGE EVAPORATOR WITH HEAT-DISSIPATING FINS AND PHASE CHANGE COOLING DEVICE USING THE SAME

(71) Applicant: Man Zai Industrial Co., Ltd., Tainan (TW)

(72) Inventors: Cheng-Feng Wan, Tainan (TW); Cheng-Chien Wan, Tainan (TW); Hao-Hui Lin, Tainan (TW)

(73) Assignee: Man Zai Industrial Co., Ltd., Tainan (TW)

( * ) Notice: Subject to any disclaimer, the term of this patent is extended or adjusted under 35 U.S.C. 154(b) by 0 days.

(21) Appl. No.: 15/791,463

(22) Filed: Oct. 24, 2017

(65) Prior Publication Data
US 2019/0069444 A1    Feb. 28, 2019

(30) Foreign Application Priority Data

Aug. 31, 2017 (CN) .................. 2017 2 1105119 U

(51) Int. Cl.
| | | |
|---|---|---|
| *F25B 41/00* | (2006.01) | |
| *H05K 7/20* | (2006.01) | |
| *F25B 39/00* | (2006.01) | |
| *F28F 3/06* | (2006.01) | |
| *F25B 39/02* | (2006.01) | |

(52) U.S. Cl.
CPC ......... *H05K 7/20309* (2013.01); *F25B 39/00* (2013.01); *F28F 3/06* (2013.01); *H05K 7/20318* (2013.01); *F25B 39/022* (2013.01)

(58) Field of Classification Search
CPC ............. H05K 7/20309; H05K 7/2029; H05K 7/20318; H05K 7/20336; H01L 23/427; H01L 23/3672; F28D 15/0266; F28D 1/05366; F28D 2021/0029; F25B 23/006; F25B 39/00; F25B 39/02
USPC .................. 62/513; 165/104.21, 104.33, 80.4
See application file for complete search history.

(56) References Cited

U.S. PATENT DOCUMENTS

| | | | | |
|---|---|---|---|---|
| 7,007,506 | B2 * | 3/2006 | Kubo ................. | F28D 15/0266 165/170 |
| 8,130,497 | B2 * | 3/2012 | Kondo .............. | H05K 7/20818 165/104.26 |
| 8,345,425 | B2 * | 1/2013 | Toyoda .............. | F28D 1/05366 165/104.26 |

(Continued)

*Primary Examiner* — Joseph F Trpisovsky
(74) *Attorney, Agent, or Firm* — Alan D. Kamrath; Kamrath IP Lawfirm, P.A.

(57) ABSTRACT

A phase change evaporator includes multiple heat-dissipating fins formed on an evaporator body of the evaporator. A cooling device includes the evaporator, a condenser, a coolant output pipe and a coolant return pipe connected between the evaporator and the condenser, and coolant filled inside a closed coolant circulation loop formed by the evaporator, the condenser, the coolant output pipe and the coolant return pipe. When the evaporator body absorbs heat, the coolant inside the evaporator body is converted into a gaseous state by the heat and then quickly dissipates the heat absorbed thereby through the heat-dissipating fins for a part of the gaseous coolant to be condensed to resume heat absorption and for the remaining part to flow to the condenser through the coolant output pipe to be condensed to a liquid state and return to the evaporator body along the coolant return pipe for heat absorption.

2 Claims, 6 Drawing Sheets

(56) References Cited

U.S. PATENT DOCUMENTS

| | | | | |
|---|---|---|---|---|
| 9,151,544 | B2* | 10/2015 | Hwang | F28D 15/00 |
| 2003/0079863 | A1* | 5/2003 | Sugito | F28D 15/0266 |
| | | | | 165/104.21 |
| 2005/0217829 | A1* | 10/2005 | Belits | F28D 15/0266 |
| | | | | 165/104.33 |
| 2011/0277491 | A1* | 11/2011 | Wu | H01L 23/4336 |
| | | | | 62/177 |
| 2016/0223230 | A1* | 8/2016 | Wan | F25B 39/00 |
| 2016/0341488 | A1* | 11/2016 | Wan | F28D 15/0266 |

* cited by examiner

PHASE CHANGE EVAPORATOR WITH HEAT-DISSIPATING FINS AND PHASE CHANGE COOLING DEVICE USING THE SAME

BACKGROUND OF THE INVENTION

1. Field of the Invention

The present invention relates to a heat-dissipating device and, more particularly, to a phase change evaporator using a phase-changeable coolant for heat dissipation and a phase change cooling device using the phase change evaporator.

2. Description of the Related Art

As we know, heat is generated by electronic devices when the electronic devices are operating. To lower the chance of irregular operation or damage to an electronic device arising from an overheat condition, by and large, a cooling device is installed at a heat-generating source of the electronic device to absorb heat generated by the heat-generating source to achieve a cooling purpose.

Conventionally, each phase change cooling device includes an evaporator and a condenser. A coolant output pipe and a coolant return pipe are connected in series to the evaporator and the condenser to form a closed coolant circulation loop with an adequate amount of coolant filled inside the coolant circulation loop. Thus, the evaporator is used to absorb heat generated by an electronic device to convert coolant in the evaporator from a liquid state to a gaseous state. The gaseous coolant flows to the condenser through the coolant output pipe for heat dissipation by virtue of an expanding cooling surface area of the condenser, such that the gaseous coolant is converted back to the liquid state. The liquid coolant then returns to the evaporator to resume heat absorption through the coolant return pipe.

As the evaporator only provides a space for the coolant to be converted from a liquid state into a gaseous state and as the entire cooling device utilizes the phase change of the coolant and the circulation of coolant between the evaporator and the condenser, the resultant cooling efficacy of the cooling device fails to be satisfactory.

SUMMARY OF THE INVENTION

An objective of the present invention is to provide a phase change evaporator with heat-dissipating fins and a phase change cooling device tackling the issue of inefficient heat-dissipating performance of the conventional phase change evaporator and phase change cooling device toward heat sources.

To achieve the foregoing objective, the phase change evaporator with heat-dissipating fins includes an evaporator body, a conducting bottom plate, and multiple heat-dissipating fins.

The evaporator body has a space, a coolant exit and a coolant inlet.

The space is defined inside the evaporator body.

The coolant exit is formed through a top wall of the evaporator body and communicates with the space.

The coolant inlet is formed through a sidewall of the evaporator body and communicates with the space.

The conducting bottom plate is mounted on a bottom of the evaporator body.

The multiple heat-dissipating fins are conductively connected with a top surface of the conducting bottom plate not occupied by the evaporator body and a top of the evaporator body.

Preferably, the evaporator body further has a partition board mounted in the space and dividing the space into a top chamber and a bottom chamber. The partition board has multiple through holes formed through the partition board for the top chamber and the bottom chamber to communicate with each other via the multiple through holes, the coolant exit communicates with the top chamber, and the coolant inlet communicates with the bottom chamber.

To achieve the foregoing objective, the phase change cooling device includes the phase change evaporator, a condenser, a coolant output pipe, a coolant return pipe, and coolant.

The condenser has a first condenser tube, multiple cooling ducts and multiple condenser fins.

The first condenser tube and a second condenser tube are mounted vertically and are spaced apart from each other.

The multiple cooling ducts are horizontally connected between the first condenser tube and the second condenser tube and are spaced apart from one another.

The multiple condenser fins conductively contact peripheries of corresponding cooling ducts.

The coolant output pipe has one end connected with the coolant exit of the evaporator body and the other end connected with the first condenser tube of the condenser.

The coolant return pipe has one end connected with the coolant inlet of the evaporator body and the other end connected with the second condenser tube of the condenser. The condenser, the coolant output pipe, and the coolant return pipe as a whole constitute a closed coolant circulation loop.

The coolant is filled inside the closed coolant circulation loop.

The present invention has the following advantages in the structure of the multiple heat-dissipating fins and a partition board inside the evaporator body. When the evaporator body absorbs heat, the coolant inside the evaporator body is converted into a gaseous state by the heat. The gaseous coolant rapidly dissipates heat through the multiple heat-dissipating fins, such that a part of the gaseous coolant located inside the evaporator body is condensed and returned to the liquid coolant, and the remaining part of the gaseous coolant flows to the condenser through the coolant output pipe and is condensed into a liquid state. The liquid coolant then returns to the evaporator body through the coolant return pipe for heat absorption again. Accordingly, an optimal heat-dissipating effect can be achieved.

Moreover, the partition board is mounted inside the space of the evaporator body to divide the space into a top chamber and a bottom chamber. The divided space inside the evaporator body taking the form of the top chamber and the bottom chamber allows the gaseous coolant in the bottom chamber converted by the absorbed heat to ascend and enter the top chamber by distributedly passing through the through holes of the partition board. The multiple heat-dissipating fins outside the evaporator body further facilitate dissipating heat carried by the gaseous coolant. Thus, a majority of gaseous coolant ascending to the top chamber can be condensed to the liquid coolant to flow back to the bottom chamber for heat absorption again, thereby attaining an optimal heat-dissipating effect with high efficacy.

Other objectives, advantages and novel features of the invention will become more apparent from the following detailed description when taken in conjunction with the accompanying drawings.

DETAILED DESCRIPTION OF THE INVENTION

Figure 1:
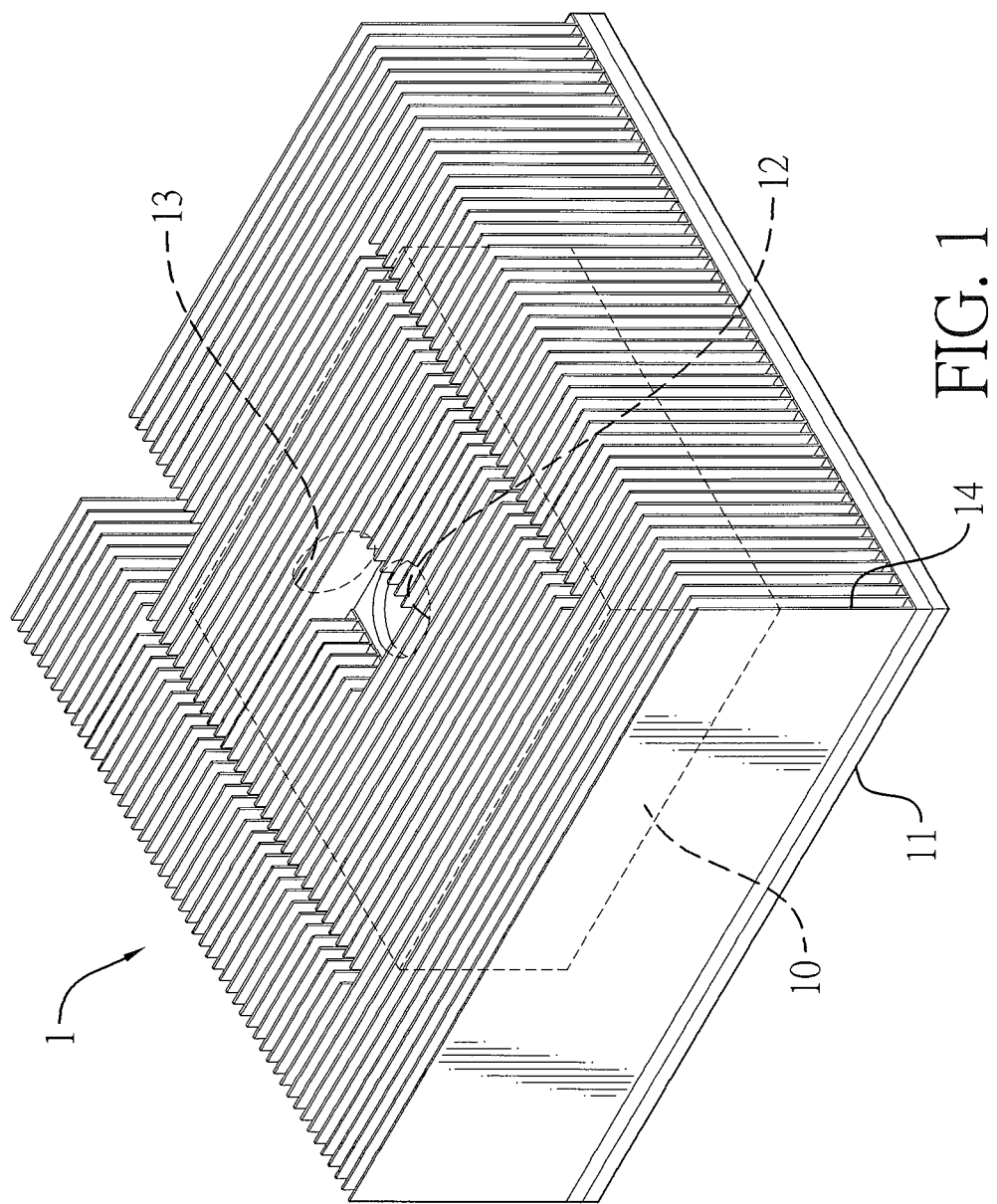
FIG. 1 is a perspective view of a phase change evaporator in accordance with the present invention.
Figure 2:
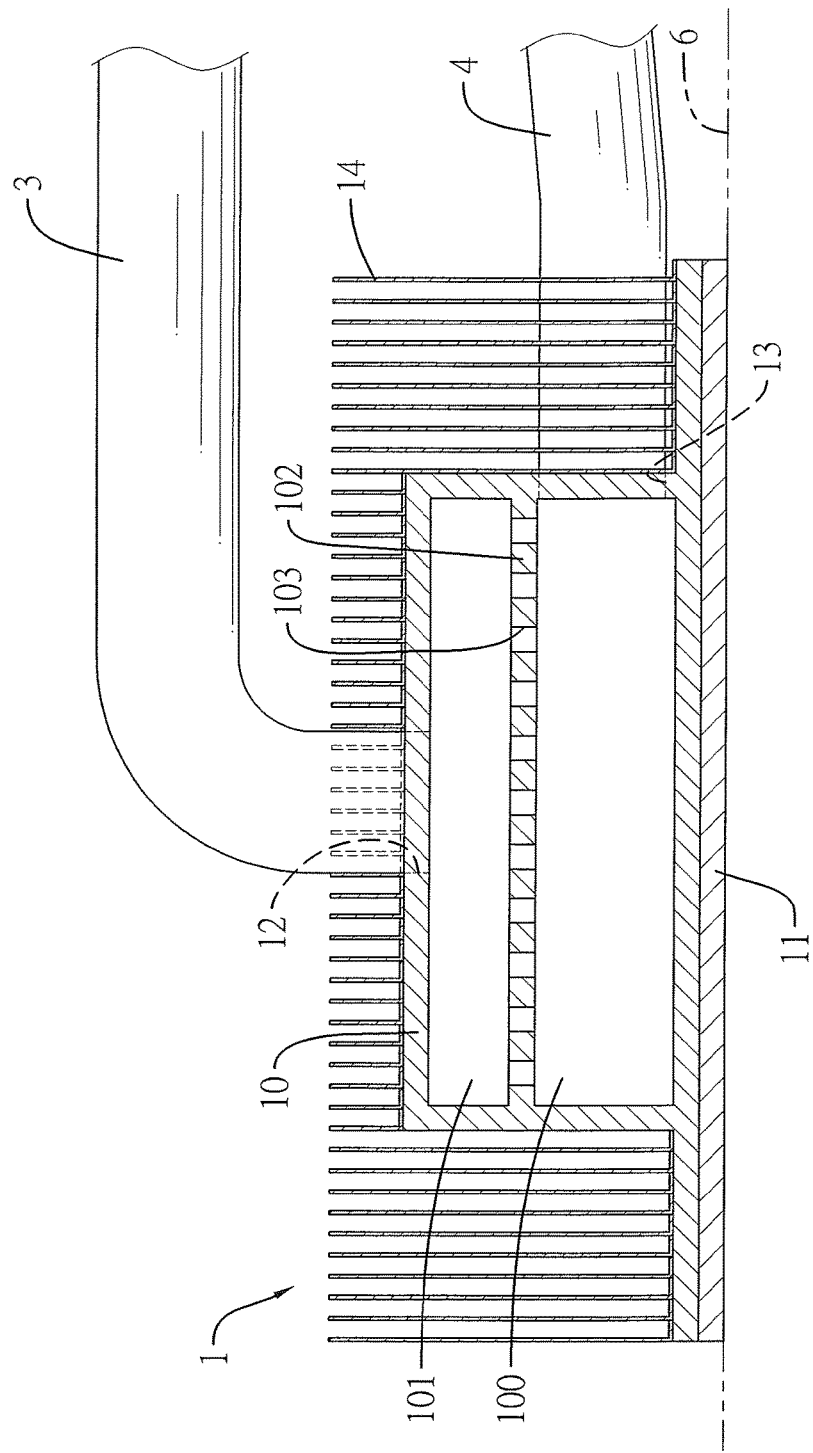
FIG. 2 is a cross-sectional view of the phase change evaporator in FIG. 1 with an additional coolant output pipe and coolant return pipe.

With reference to FIGS. 1 and 2, a phase change evaporator 1 with heat-dissipating fins in accordance with the present invention includes an evaporator body 10, a conducting bottom plate 11, and multiple heat-dissipating fins 14. The evaporator body 10 is mounted on a top surface of the conducting bottom plate 11. The multiple heat-dissipating fins 14 are conductively connected with the top surface of the conducting bottom plate 11 not occupied by the evaporator body 10 and a top of the evaporator body 10.

The evaporator body 10 has a space, a coolant exit 12 and a coolant inlet 13. The space is defined inside the evaporator body 10. The coolant exit 12 is formed through a top wall of the evaporator body 10 and communicates with the space inside the evaporator body 10. The coolant inlet 13 is formed through a sidewall of the evaporator body 10 and communicates with the space inside the evaporator body 10. In the present embodiment, the evaporator body 10 further has a partition board 102 mounted in the space and dividing the space into a top chamber 101 and a bottom chamber 100. The partition board 102 has multiple through holes 103 formed through the partition board 102 for the top chamber 101 and the bottom chamber 100 to communicate with each other via the multiple through holes 103. The coolant exit 12 communicates with the top chamber 101. The coolant inlet 13 communicates with the bottom chamber 100.

Figure 3:
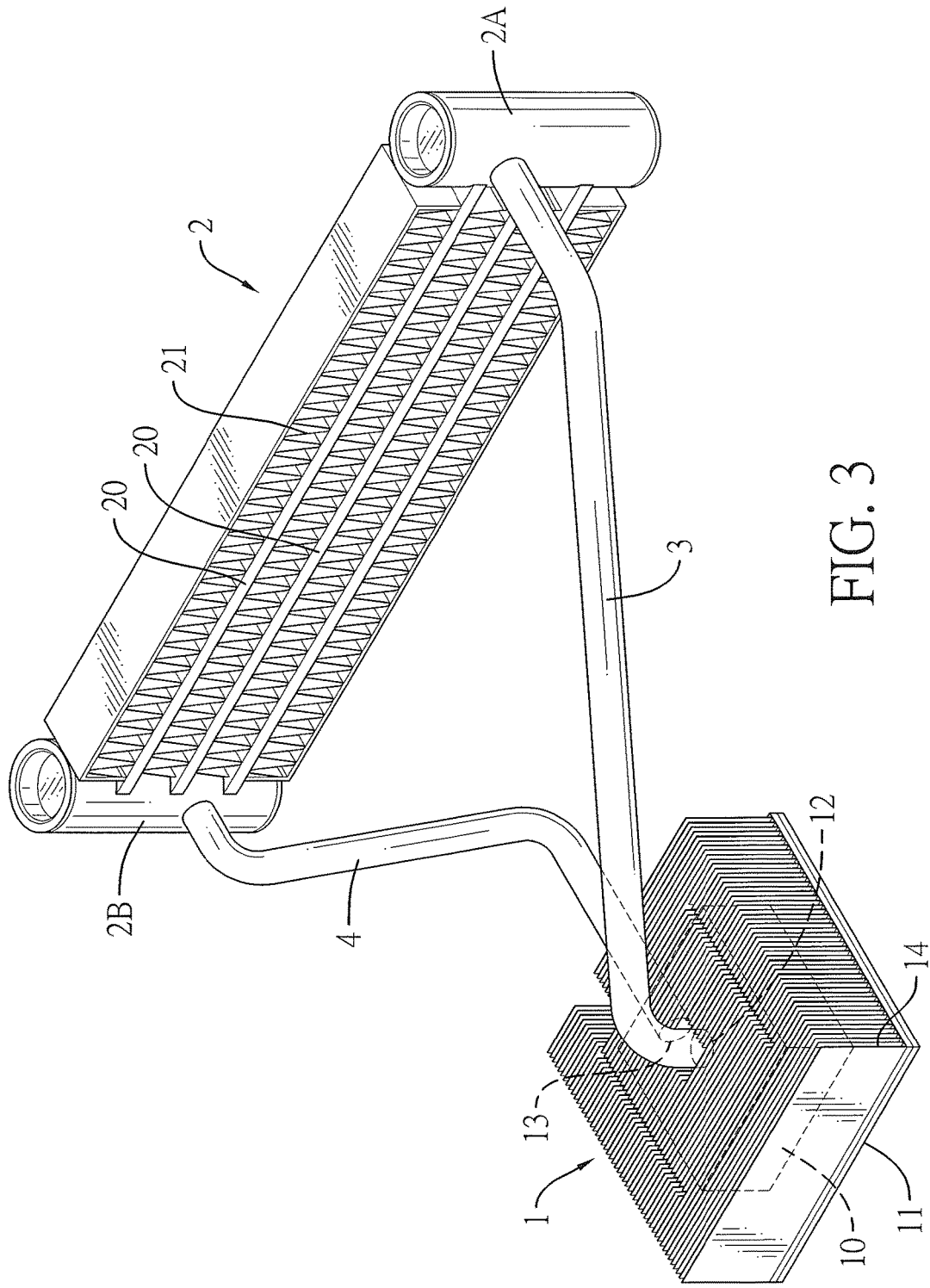
FIG. 3 is a perspective view of a phase change cooling device in accordance with the present invention.
Figure 4:
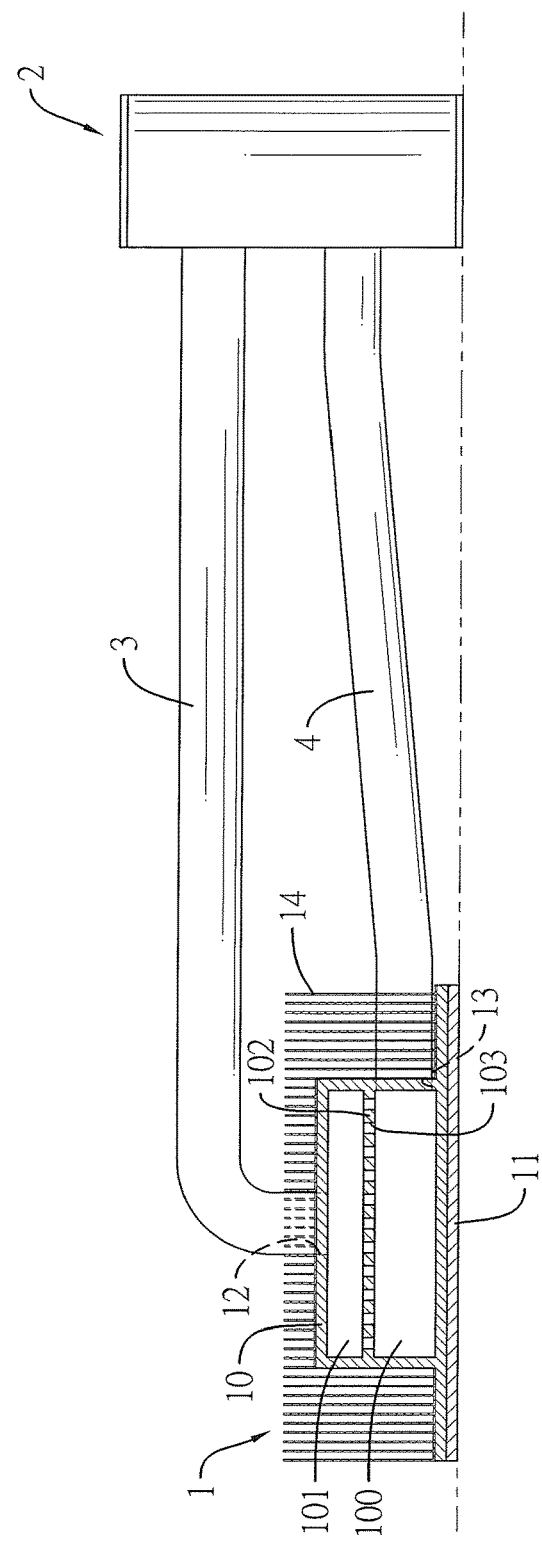
FIG. 4 is a side view in partial section of the phase change cooling device in FIG. 3.
Figure 5:
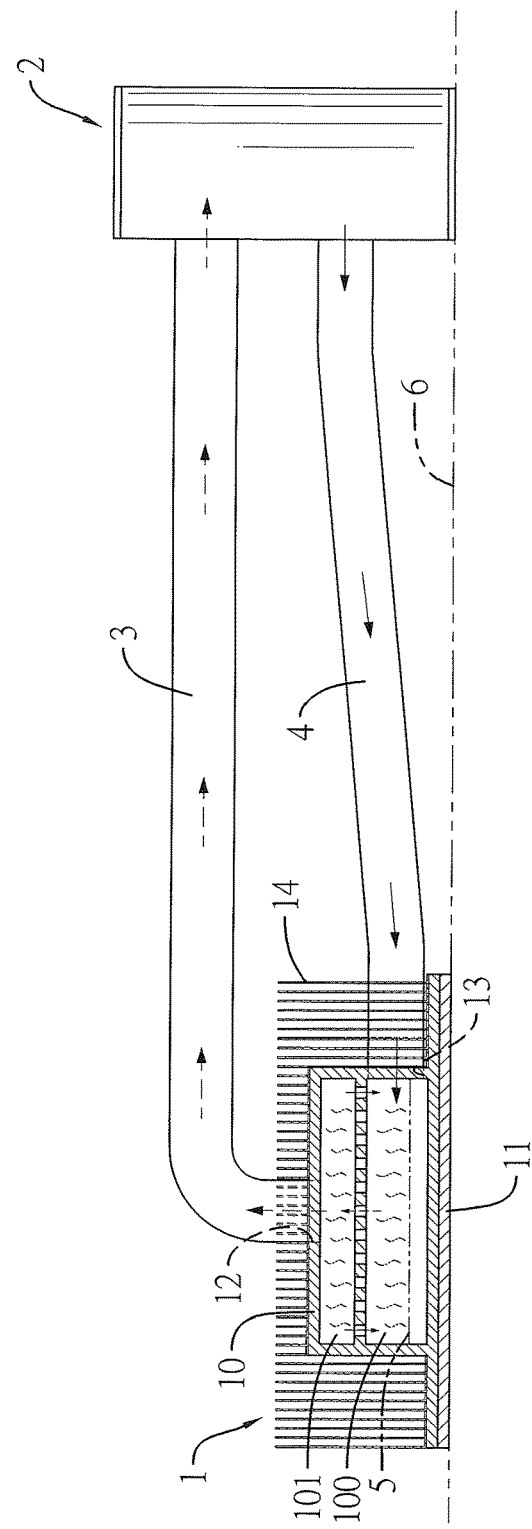
FIG. 5 is an operational side view in partial section of the phase change cooling device in FIG. 3.

With reference to FIGS. 3, 4 and 5, a phase change cooling device in accordance with the present invention includes the foregoing phase change evaporator 1, a condenser 2, a coolant output pipe 3, a coolant return pipe 4 and coolant 5.

The condenser 2 has a first condenser tube 2A, a second condenser tube 2B, multiple cooling ducts 20, and multiple condenser fins 21. The first condenser tube 2A and the second condenser tube 213 are mounted vertically and are spaced apart from each other. The multiple cooling ducts 20 are horizontally connected between the first condenser tube 2A and the second condenser tube 2B and are spaced apart from one another. The condenser fins 21 conductively contact peripheries of corresponding cooling ducts 20.

One end of the coolant output pipe 3 is connected with the coolant exit 12 of the evaporator body 10, and the other end of the coolant output pipe 3 is connected with the first condenser tube 2A of the condenser 2. One end of the coolant return pipe 4 is connected with the coolant inlet 13 of the evaporator body 10, and the other end of the coolant return pipe 4 is connected with the second condenser tube 2B of the condenser 2. As such, the phase change evaporator 1, the condenser 2, the coolant output pipe 3 and the coolant return pipe 4 as a whole constitute a closed coolant circulation loop with the coolant 5 filled inside the closed coolant circulation loop.

Figure 6:
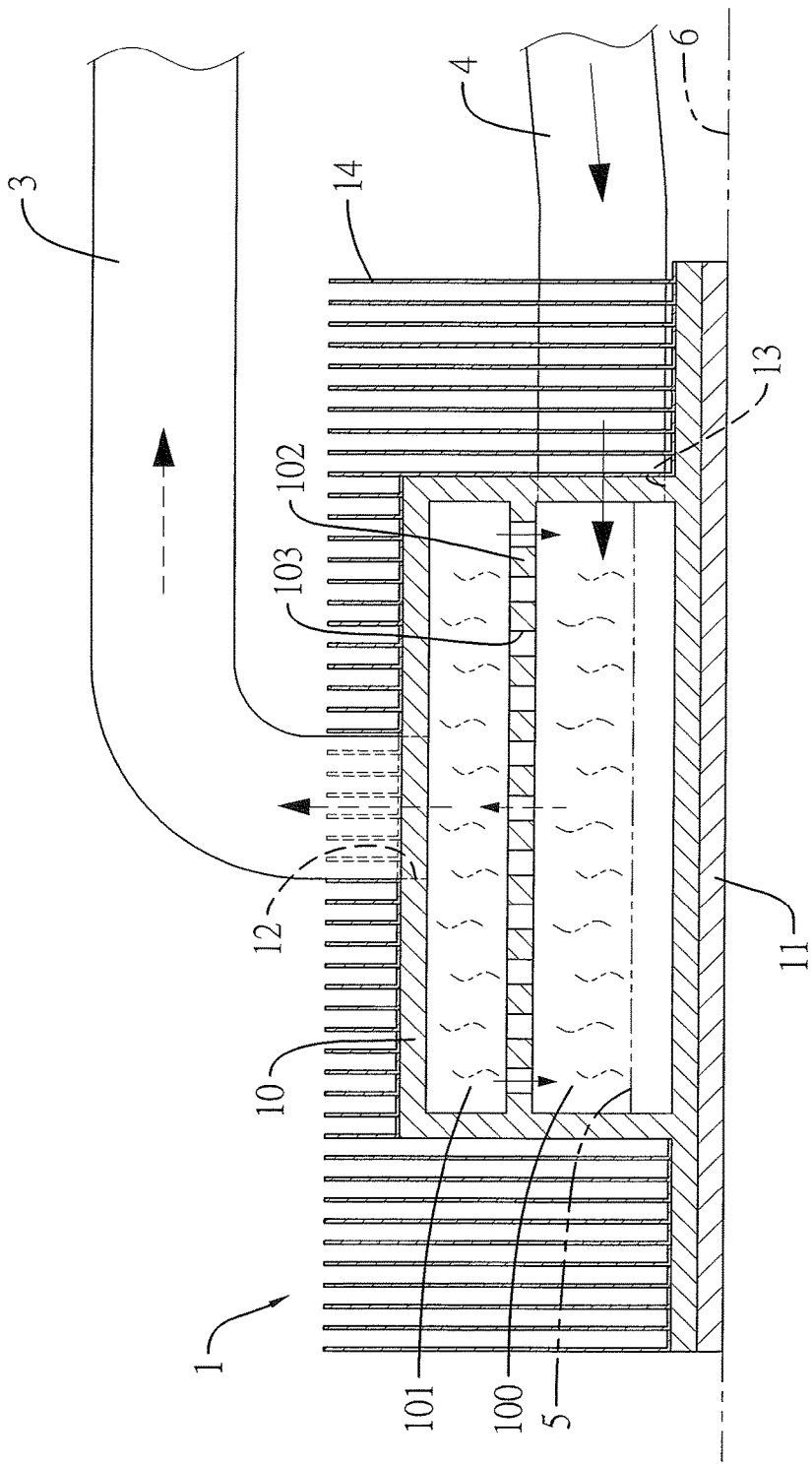
FIG. 6 is an enlarged operational side view in partial section of the phase change cooling device in FIG. 5.

With reference to FIGS. 5 and 6, when the phase change cooling device is applied to a heat-generating source 6 of an electronic device, the phase change cooling device adopts the conducting bottom plate 11 of the phase change evaporator 1 to conductively contact the heat-generating source 6. Heat generated by the heat-generating source 6 is transferred to the coolant 5 in a liquid state inside the evaporator body 10 via the conducting bottom plate 11. When the coolant 5 in the liquid state inside the evaporator body 10 absorbs the heat and is converted into a gaseous state, heat carried by the gaseous coolant is dissipated through an overall cooling surface area contributed by the multiple heat-dissipating fins 14 distributed on the evaporator body 10 and the conducting bottom plate 11. Air flow surrounding the multiple heat-dissipating fins 14 rapidly carries away the heat, such that a part of the gaseous coolant in the evaporator body 10 is condensed into the liquid state for further heat absorption and such that the remaining part of the gaseous coolant that is not condensed flows to the condenser 2 through the coolant output pipe 3 to be condensed to the liquid coolant 5. The liquid coolant 5 then returns to the evaporator body 10 through the coolant return pipe 4 to resume heat absorption. As a result, a heat-dissipating effect with high efficacy can be attained.

In the course of the foregoing cooling process, the evaporator body 10 can further take the advantages of the structure of the evaporator body 10 having the partition board 102 with the multiple through holes 103 to divide the space inside the evaporator body 10 into the bottom chamber 100 and the top chamber 101. After the liquid coolant 5 that enters the bottom chamber 100 passes through the conducting bottom plate 11 and is converted into a gaseous state by heat absorbed from the conducting bottom plate 11, the gaseous coolant gradually ascends and distributedly passes the multiple through holes 103 of the partition board 102 to enter the top chamber 101. Given the fast cooling effect of the multiple heat-dissipating fins 14 on the evaporator body 10 and the conducting bottom plate 11, a majority of the gaseous coolant ascending to the top chamber 101 can be directly condensed to the liquid coolant 5 flowing back to the bottom chamber 100 for further heat absorption. The gaseous coolant that is not condensed flows to the condenser 2 through the coolant output pipe 3. The gaseous coolant flowing to the condenser 2 first flows in the first condenser tube 2A and then distributedly flows through the multiple cooling ducts 20 to enter the second condenser tube 2B. During such process, heat carried by the gaseous coolant is transferred through an expanded cooling surface area contributed by the multiple condenser fins 21 contacting the multiple cooling ducts 20 to cool down the gaseous coolant passing through the multiple cooling ducts for the gaseous coolant to be condensed into a liquid state. The liquid coolant 5 then returns to the evaporator body 10 of the phase change evaporator 1 through the coolant return pipe 4 to resume heat absorption. By repeating the foregoing coolant circulation cycles, the phase change cooling device can achieve the heat-dissipating effect with high efficacy.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A phase change evaporator comprising:
an evaporator body having:
a space defined inside the evaporator body;
a partition board mounted in the space and dividing the space into a top chamber and a bottom chamber and having multiple through holes formed through the partition board for the top chamber and the bottom chamber to communicate with each other via the multiple through holes;
a coolant exit formed through a top wall of the top chamber of the evaporator body above the partition board and directly communicating with the top chamber; and
a coolant inlet formed through a sidewall of the bottom chamber of the evaporator body below the partition board and directly communicating with the bottom chamber, with the partition plate being intermediate the coolant exit and the coolant inlet;
a conducting bottom plate mounted on a bottom of the evaporator body and configured to absorb heat generated by a heat-generating source, with the coolant inlet located intermediate the bottom of the evaporation body and the partition board; and
multiple heat-dissipating fins conductively connected with a top surface of the conducting bottom plate not occupied by the evaporator body and the top wall of the evaporator body.

2. A phase change cooling device comprising:
the phase change evaporator as claimed in claim 1;
a condenser having:
a first condenser tube and a second condenser tube mounted vertically and spaced apart from each other;
multiple cooling ducts horizontally connected between the first condenser tube and the second condenser tube and spaced apart from one another; and
multiple condenser fins conductively contacting peripheries of corresponding cooling ducts;
a coolant output pipe with one end connected with the coolant exit of the evaporator body and with another end connected with the first condenser tube of the condenser;
a coolant return pipe with one end connected with the coolant inlet of the evaporator body and with another end connected with the second condenser tube of the condenser, wherein the condenser, the coolant output pipe and the coolant return pipe as a whole constitute a closed coolant circulation loop; and
coolant filled inside the closed coolant circulation loop.

* * * * *